United States Patent [19]

Mes

[11] Patent Number: 5,734,342
[45] Date of Patent: Mar. 31, 1998

[54] ANALOG-TO-DIGITAL CONVERTER FOR GENERATING A DIGITAL N-BIT GRAY CODE

[75] Inventor: Johannes A. M. Mes, Eindhoven, Netherlands

[73] Assignee: U.S. Philips Corporation, New York, N.Y.

[21] Appl. No.: 677,233

[22] Filed: Jul. 9, 1996

[30] Foreign Application Priority Data

Jul. 11, 1995 [EP] European Pat. Off. ............ 95201892

[51] Int. Cl.$^6$ .................................................. H03M 1/00
[52] U.S. Cl. ...................................... 341/159; 341/155
[58] Field of Search ............................... 341/159, 155, 341/172

[56] References Cited

U.S. PATENT DOCUMENTS

| | | | |
|---|---|---|---|
| 4,275,386 | 6/1981 | Michel et al. | 340/347 |
| 4,656,371 | 4/1987 | Binet et al. | 307/362 |
| 5,075,574 | 12/1991 | Boudon | 307/443 |
| 5,196,737 | 3/1993 | Olmstead | 307/279 |
| 5,362,994 | 11/1994 | Lin | 327/172 |
| 5,376,937 | 12/1994 | Colleran et al. | 341/159 |
| 5,554,943 | 9/1996 | Moreland | 327/65 |

OTHER PUBLICATIONS

"An 8-Bit 100-MHz Full-Nyquist Analog-to-Digital Converter", by R.J. Van de Plassche et al, IEEE Journal of Solid-State Circuits, vol. 23, No. 6, Dec. 1988, pp. 1334–1344.

Primary Examiner—Jeffrey A. Gaffin
Assistant Examiner—Peguy JeanPierre
Attorney, Agent, or Firm—Leroy Eason

[57] ABSTRACT

A full-flash N-bit analog-to-digital converter with Gray-code digital output ($V_{out}$) comprises only N current sources ($CS_1$, $CS_2$, $CS_3$) to power the $2^N-1$ differential amplifiers connected to a voltage reference ladder RL and only N latches ($L_1$, $L_2$, $L_3$) which directly furnish an N-bit Gray code at their outputs (LO). For this purpose the differential amplifiers are grouped and stacked in a particular manner and the output signals of the individual differential amplifiers in a group are cross-coupled to the inputs ($LI_1$, $LI_2$) of the latch associated with the group.

1 Claim, 2 Drawing Sheets

| $V_{in}$ | $VL_7$ | $VL_6$ | $VL_5$ | $VL_4$ | $VL_3$ | $VL_2$ | $VL_1$ | $V_{out}$ | | |
|---|---|---|---|---|---|---|---|---|---|---|
| 0 | 0 | 0 | 0 | 0 | 0 | 0 | 0 | 0 | 0 | 0 |
| 1 | 0 | 0 | 0 | 0 | 0 | 0 | 1 | 0 | 0 | 1 |
| 2 | 0 | 0 | 0 | 0 | 0 | 1 | 1 | 0 | 1 | 0 |
| 3 | 0 | 0 | 0 | 0 | 1 | 1 | 1 | 0 | 1 | 1 |
| 4 | 0 | 0 | 0 | 1 | 1 | 1 | 1 | 1 | 0 | 0 |
| 5 | 0 | 0 | 1 | 1 | 1 | 1 | 1 | 1 | 0 | 1 |
| 6 | 0 | 1 | 1 | 1 | 1 | 1 | 1 | 1 | 1 | 0 |
| 7 | 1 | 1 | 1 | 1 | 1 | 1 | 1 | 1 | 1 | 1 |

ANALOG-TO-DIGITAL CONVERTER FOR GENERATING A DIGITAL N-BIT GRAY CODE

BACKGROUND OF THE INVENTION

Field of the Invention

The invention relates to an analog-to-digital converter for converting an analog input signal into an N-bit digital output signal, N being an integer greater than 0, comprising: a series arrangement of $2^N$ resistors having tapping points there-between for deriving $2^N-1$ different reference voltages from a voltage source; a plurality of differential amplifiers each having a control electrode, main electrodes and a common terminal, the control electrode of each being connected to a respective one of the tapping points, the common terminals of a number being connected to respective ones of a plurality of current sources; and a plurality of latch circuits respectively coupled to main electrodes of one or several of the differential amplifiers.

Such an analog-to-digital converter (ADC) is also referred to as a full-parallel flash converter and is known from, inter alia, IEEE Journal of Solid-State Circuits, Vol. 23, No. 6, December 1988, pp. 1334–1344, Van de Plassche et al., "An 8-bit 100-MHz Full-Nyquist Analog-to-Digital Converter", page 1336, FIG. 1. The circuit diagram of such an ADC is shown in FIG. 1. This Figure relates to a 3-bit ADC, i.e. N=3. By means of $2^N-1=7$ differential amplifiers $D_i$(i=1..$2^N-1$) the input signal $V_{in}$ is compared with $2^N-1=7$ reference voltages appearing at a corresponding number of tapping points $N_i$ of a reference ladder RL. Each differential amplifier $D_i$ comprises two transistors $T_1$, $T_2$ arranged as a differential pair. The common terminal of each differential pair $D_i$ is coupled to a current source $CS_i$, whose current is divided between the two transistors in dependence upon the voltage difference between the input voltage $V_{in}$ and the reference voltage at the relevant tapping point $N_i$. By means of $2^N-1=7$ latches the individual difference signals from the differential amplifiers $D_i$ are converted into output signals $VL_i$ which indicate whether the input voltage $V_{in}$ is greater or smaller than the relevant reference voltage at the reference ladder. As the input signal $V_{in}$ increases the signals $VL_i$ changes in accordance with a thermometer-like code, which code is subsequently converted into the desired N-bit digital output signal $V_{out}$ by means of a code converter CCNV and three additional latches $L_A$, $L_B$ and $L_C$. In principle, the code of the N-bit output signal is arbitrary but a frequently used code is the Gray code, in which for the least change in input voltage $V_{in}$ which leads to a change of the N-bit output signal $V_{out}$ the output signal $V_{out}$ changes by only one bit at a time. In this known full-parallel flash ADC the number of current sources $CS_i$ and the number of latches $L_i$ is equal to the number of tapping points $N_i$ of the reference ladder. The number of parts and the resulting chip area and current consumption increase considerably when the number of bits is increased. Inter alia in said article a folding and interpolation architecture is proposed by means of which the number of latches can be reduced considerably. However, the number of current sources remains the same and a code converter remains necessary to convert the thermometer code into a Gray code.

SUMMARY OF THE INVENTION

It is an object of the invention to provide a simplified analog-to-digital converter for converting an analog input signal into a Gray-coded digital signal. To achieve this, according to the invention, the analog-to-digital converter of the type defined in the opening paragraph is characterised in that the plurality of $2^N-1$ differential pairs is divided into N groups having a group number G, G being an integer from 1 through N, the group having the group number G comprising $2^{G-1}$ differential pairs; the control electrode of the second transistor of the group number G=1 is connected to the central tapping point of the $2^N-1$ tapping points, leaving residual groups of residual tapping points at either side of the central tapping point; the control electrodes of the second transistors of the group numbers G=2 through N are connected to different central tapping points of the residual groups of tapping points left by the preceding group having the group number G=1.

The analog-to-digital converter in accordance with the invention comprises only N current sources instead of $2^N-1$ +N. Moreover, the desired Gray code is directly available at the outputs of the latches, so that a code converter is no longer needed. The ADC in accordance with the invention therefore requires less parts with a smaller current consumption and a smaller chip area. The smaller number of latches also reduces the noise level.

BRIEF DESCRIPTION OF THE DRAWINGS

These and other aspects of the invention will be described and elucidated with reference to the accompanying drawings, in which

FIG. 1 shows a known Gray code analog-to-digital converter (ADC). This Figure relates to a 3-bit ADC, i.e. N=3. By means of $2^N-1=7$ differential amplifiers $D_i$(i=1..$2^N-1$) the input signal $V_{in}$ at an input terminal IT is compared with $2^N-1=7$ reference voltages appearing at a corresponding number of tapping points $N_i$ of a reference ladder RL, which tapping points have been numbered consecutively starting from an end $RT_1$ of the reference ladder RL. The reference ladder RL comprises a series arrangement of resistors connected to one another in the tapping points $N_i$. A positive reference voltage is applied across the ends $RT_1$ and $RT_2$ of the series arrangement and is divided into steps by the reference ladder RL. Each differential amplifier $D_i$ comprises two PMOS transistors $T_1$, $T_2$ arranged as a differential pair. The control electrode or gate of the first transistor $T_1$ of each differential pair $D_i$ is connected to the input terminal IT to receive the input signal $V_{in}$. The gate of the second transistor $T_2$ of a differential pair $D_i$ is connected to a tapping point $N_i$ having the same sequence number i, so that in the case of a progressively decreasing input voltage an increasing number of individual transistors $T_1$ of differential amplifiers $D_i$ having increasing sequence numbers i are turned on. The first main electrodes or sources of the transistors $T_1$ and $T_2$ of each differential pair $D_i$ are commoned at a respective common terminal $CN_i$, which is coupled to a respective current source $CS_i$, to receive a current which is divided between the two transistors $T_1$ and $T_2$ of the relevant differential pair $D_i$ in dependence upon the voltage difference between the input voltage $V_{in}$ and the reference voltage at the relevant tapping point $N_i$. The second main electrode or drain of the first transistor $T_1$ of each differential amplifier $D_i$ is connected to a first latch input terminal $LI_1$ of a respective latch $L_i$, which has a second latch input terminal $LI_2$ connected to the drain of the second transistor $T_2$ of the relevant differential amplifier $D_i$. The latches $L_i$ are clocked by a clock signal generator CLK and are responsive to the difference current of the relevant differential amplifier $D_i$. However, voltage-responsive latches are also possible by arranging resistors between the latch input terminals and a suitable supply voltage. By means of $2^N-1=7$ latches the individual difference signals from the differential amplifiers $D_i$ are converted into output signals $VL_i$ which indicate whether the input voltage $V_{in}$ is greater or smaller than the relevant reference voltage at the reference ladder. When the input signal $V_{in}$ increases progressively the signals $VL_i$ changes in accordance with a thermometer-like code, which code is subsequently convened into the desired 3-bit digital output signal $V_{out}$ by means of a code converter CCNV and three additional latches $L_A$, $L_B$ and $L_C$. In principle, the code of the N-bit output signal is arbitrary but a frequently used code is the Gray code, in accordance with which the 3-bit output signal $V_{out}$ changes by only one bit at a time for each smallest change of the input voltage $V_{in}$ which causes the output signal $V_{out}$ to change. FIG. 3 gives the thermometer code of $VL_i$ and the Gray code of $V_{out}$ for consecutive values of $V_{in}$, which for the sake of simplicity are represented by the values 0 to 7.

In this known full-parallel flash ADC the number of current sources $CS_i$ and the number of latches $L_i$ is equal to the number of tapping points $N_i$ of the reference ladder. FIG. 2 shows a full-parallel Gray code ADC in accordance with the invention. This is again a 3-bit version with PMOS transistors. By means of $2^N-1=7$ differential amplifiers $D_i$ ($i= 1..2^N-1$) the input signal $V_{in}$ at an input terminal IT is compared with $2^N-1=7$ reference voltages appearing at a corresponding number of tapping points $N_i$ of a reference ladder RL, which tapping points have been numbered consecutively starting from an end $RT_1$ of the reference ladder RL. In the same way as in FIG. 1, the reference ladder RL comprises a series arrangement of resistors connected to one another in the tapping points $N_i$. A positive reference voltage is applied to the ends $RT_1$ and $RT_2$ of the series arrangement and is divided into steps by the reference ladder RL. Each differential amplifier $D_i$ comprises two PMOS transistors $T_1$, $T_2$ arranged as a differential pair. The control electrode or gate of the first transistor $T_1$ of each differential pair $D_i$ is connected to the input terminal IT to receive the input signal $V_{in}$. The gate of the second transistor $T_2$ of a differential pair $D_i$ is connected to a tapping point $N_i$ having the same sequence number i, so that in the case of a progressively decreasing input voltage an increasing number of individual transistors $T_1$ of differential amplifiers $D_i$ having increasing sequence numbers i are turned on. The differential amplifiers $D_i$ are divided into N=3 groups having group numbers G=1, 2 and 3. Each group comprises $2^{G-1}$ differential pairs. Group 1 comprises one differential pair, i.e. $D_4$, group 2 comprises two differential pairs, i.e. $D_2$ and $D_6$, and group 3 comprises four differential pairs, i.e. $D_1$, $D_3$, $D_5$ and $D_7$. In the case of an extension to 4 bits, i.e. if N=4, the fourth group will comprise 8 differential pairs.

Figure 1:
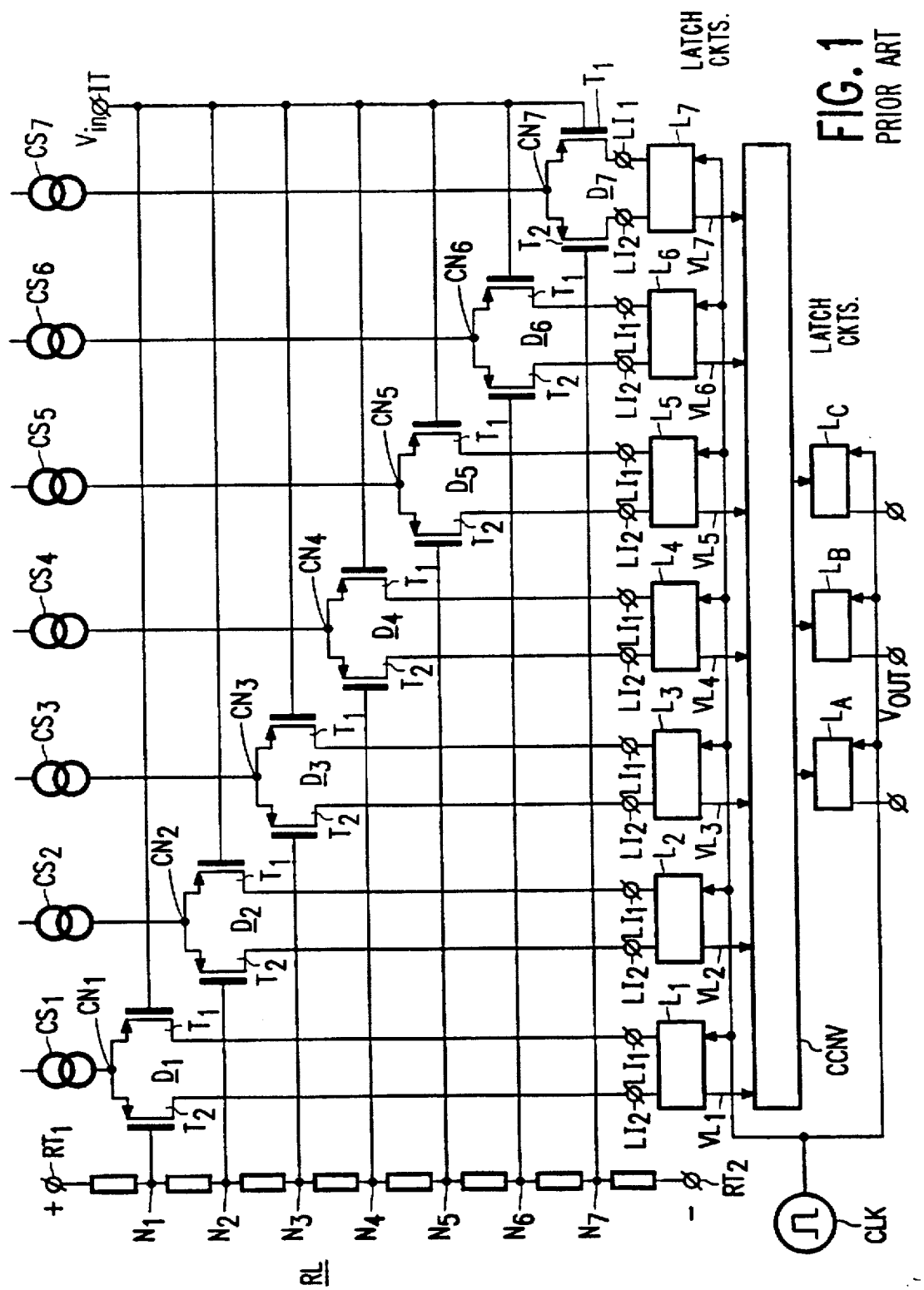
FIG. 1 shows a prior-art 3-bit Gray code analog-to-digital converter.
Figures 2, 3:
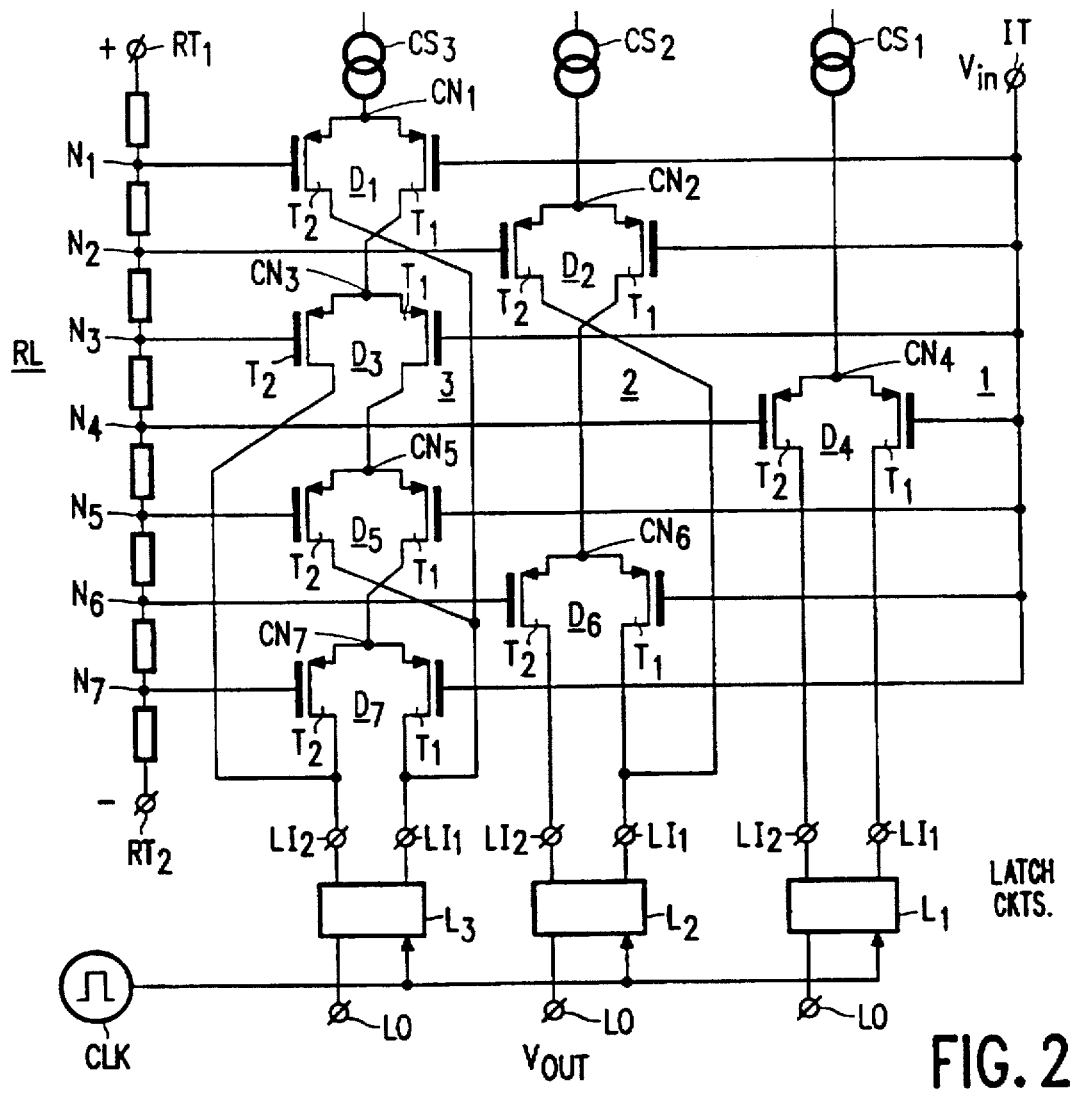
FIG. 2 shows a 3-bit Gray code analog-to-digital converter in accordance with the invention.
FIG. 3 is a Table of digital signals for a 3-bit Gray code analog-to-digital converter.

The gate of the second transistor $T_2$ of the group bearing the lowest group number 1 is connected to the central tapping point $N_4$ of the reference ladder. Since the sequence number of the differential pair is equal to the sequence number of the tapping point, this will be the differential pair $D_4$. Two residual groups of residual tapping points, i.e. tapping points which are not yet used, are left at either side of the tapping point $D_4$. Each of these residual groups again has a central point, i.e. the tapping point $N_2$ and the tapping point $N_6$. These tapping points are connected to the gates of the second transistors $T_2$ of the two differential amplifiers of group 2, i.e. the differential amplifiers having the sequence numbers 2 and 6. Again residual groups of unused tapping points remain at either side of the tapping points $N_2$ and $N_6$, i.e. $N_1$ and $N_3$ at either side of $N_2$ and $N_5$ and $N_7$ at either side of $N_6$. These residual groups comprise only one tapping point. These four tapping points are connected to the gates of the second transistors $T_2$ of the four differential amplifiers of group 3, i.e. the differential amplifiers with the sequence numbers 1, 3, 5 and 7. For N=4 there are four groups G=1, 2, 3 and 4 of 1, 2, 4 and 8 differential amplifiers, respectively, of which the gates of the second transistors should be connected to 15 tapping points. The gate of group G=1 is then connected to the tapping point $N_8$; the gates of group G=2 to the tapping points $N_4$ and $N_{12}$; the gates of group G=3 to the tapping points $N_2$, $N_6$, $N_{10}$ and $N_{14}$; and the gates of group G=4 to the tapping points $N_1$, $N_3$, $N_5$, $N_7$, $N_9$, $N_{11}$, $N_{13}$ and $N_{15}$.

Each group has one current source, i.e. a current source $CS_1$ for group 1, a current source $CS_2$ for group 2 and a current source $CS_3$ for group 3. Consequently, there are only N=3 current sources instead of $2^N-1=7$ current sources in FIG. 1. Each of the current sources is connected to a common terminal CN of the differential pair having the smallest sequence number within the relevant group, i.e. the current source $CS_1$ is connected to the common terminal $CN_4$ of the differential pair $D_4$ of group 1; the current source $CS2_2$ is connected to the common terminal $CN_2$ of the differential pair $D_2$ of group 2; and the current source $CS_3$ is connected to the common terminal $CN_1$ of the differential pair $D_1$ of group 3. Within each group of more than one differential amplifier the differential amplifiers are stacked in such a manner that the common terminal $CN_i$ of a differential amplifier $D_i$ having a higher sequence number i within this group is coupled to the drain of the first transistor $T_1$ of the differential amplifier having the next lower sequence number within the relevant group. Thus, in group 2 the common terminal $CN_6$ is connected to the drain of the first transistor $T_1$ of the differential amplifier $D_2$ of group 2. In group 3 the common terminal $CN_7$ is connected to the drain of the first transistor $T_1$ of the differential amplifier $D_5$, the common terminal $CN_5$ to the drain of the first transistor $T_1$ of the differential amplifier $D_3$, and the common terminal $CN_3$ to the drain of the first transistor T1 of the differential amplifier $D_1$.

Each group includes one latch, i.e. the latch $L_1$ for group 1, the latch $L_2$ for group 2 and the latch $L_3$ for group 3. This means that there are only N=3 latches instead of the $2^N-1=7$ latches in FIG. 1. Each of the latches has a first latch input terminal $LI_1$, a second latch input terminal $LI_2$ and a latch output terminal LO, which supplies one bit of the Gray-code output signal $V_{out}$. The latches are clocked in a manner similar to that shown in FIG. 1.

The drain of the first transistor $T_1$ of the differential amplifier having the highest sequence number within a group is coupled to the first latch input terminal $LI_1$ of the latch belonging to that group. Consequently, the drain of the first transistor $T_1$ of the differential pair $D_4$ of group 1 is coupled to the first latch input $LI_1$ of the latch $L_1$; the drain of the first transistor $T_1$ of the differential pair $D_6$ of group 2 is coupled to the first latch input $LI_1$ of the latch $L_2$; and the drain of the first transistor $T_1$ of the differential pair $D_7$ of group 3 is coupled to the first latch input $LI_1$ of the latch $L_3$. The drains of the second transistors $T_2$ of the differential pairs of descending sequence number within a group are alternately coupled to the second latch input terminal $LI_2$ and the first latch input terminal $LI_1$ of the latch belonging to that group. This means that the drain of the second transistor $T_2$ of the differential pair $D_4$ of group 1 is coupled to the second latch input terminal $LI_2$ of the latch $L_1$. The drain of the second transistor $T_2$ of the differential pair $D_6$ of group 2 is coupled to the second latch input terminal $LI_2$ of the latch $L_2$, and the drain of the second transistor $T_2$ of the differential pair $D_2$ of group 2 is coupled to the first latch input terminal $LI_1$ of the latch $L_2$. In the third group the drains of the second transistors $T_2$ of the differential pairs $D_7$ and $D_3$ are coupled to the second latch input $LI_2$ of the latch $L_3$ and the drains of the second transistors $T_2$ of the differential pairs $D_5$ and $D_1$ are coupled to the first latch input $LI_1$ of the latch $L_3$.

The latches $L_1$, $L_2$ and $L_3$ directly produce a Gray-coded 3-bit digital signal at their outputs LO. Consequently, in contradistinction to the known analog-to-digital converter shown in FIG. 1, no code converter is required. Moreover, a smaller number of current sources $CS_i$ and a smaller number of latches $L_i$ are needed, which results in a substantial reduction in current consumption and chip area. Owing to the smaller number of latches the resulting noise level is also smaller, which is favourable in the case of a combination with analog functions on one chip, or one module or one printed circuit board.

The invention has been described for N=3 bits but an extension to a more bits is possible when the indications given for the 3-bit version are observed. The PMOS transistors may be replaced by NMOS transistors. Implementation by means of vacuum tubes (triodes) or bipolar transistors is not excluded. In the case of bipolar transistors the first main electrode, the second main electrode and the control electrode correspond to the emitter, the collector and the base, respectively.

What is claimed is:

1. An analog-to-digital converter for converting an analog input signal ($V_{in}$) into an N-bit digital output signal ($V_{out}$), N being an integer greater than 0, comprising:

an input terminal (IT) for receiving the analog input signal;

a series arrangement (RL) of a multiplicity of resistors which are connected to one another at $2^N-1$ tapping points ($N_i$), numbered in ascending order with sequence numbers 1 through $2^N-1$, to supply $2^N-1$ different reference voltages derived from a voltage source which is connectable to the series arrangement;

a plurality of $2^N-1$ differential pairs ($D_i$), numbered in ascending order with sequence numbers 1 through $2^N-1$, each differential pair ($D_i$) comprising a common terminal ($CN_i$), a first transistor ($T_1$) having a first main electrode connected to the common terminal ($CN_i$), a second main electrode, and a control electrode coupled to the input terminal (IT), a second transistor ($T_2$) having a first main electrode connected to the common terminal ($CN_i$), a second main electrode, and a control electrode coupled to a tapping point ($N_i$) having the same sequence number as the relevant differential pair ($D_i$);

a plurality of current sources ($CS_i$) respectively coupled to the common terminals ($CN_i$) of a number of the differential pairs ($D_i$); and a plurality of latches ($L_i$) each having a first latch input terminal ($LI_1$) and a second latch input terminal ($LI_2$) coupled to one or more of the second main electrodes of the first ($T_1$) and the second ($T_2$) transistors of the differential pairs ($D_i$); characterised in that:

the plurality of $2^N-1$ differential pairs ($D_i$) is divided into N groups having a group number G, G being an integer from 1 through N, the group having the group number G comprising $2^{G-1}$ differential pairs;

the control electrode of the second transistor ($T_2$) of the group having the group number G=1 is connected to the central tapping point ($N_4$) of the $2^N-1$ tapping points ($N_i$), leaving residual groups of residual tapping points at either side of the central tapping point ($N_4$);

the control electrodes of the second transistors ($T_2$) of the groups having the group numbers G=2 through N are connected to different central tapping points of the residual groups of residual tapping points left by the preceding group having the group number G-1; and for each group:

the common terminal ($CN_i$) of the differential amplifier ($D_i$) having the lowest sequence number within the relevant group is coupled to a respective current source ($CS_1$, $CS_2$, $CS_3$) of the plurality of current sources;

the common terminal ($CN_i$) of a differential amplifier having a higher sequence number in the relevant group is coupled to the second main electrode of the first transistor ($T_1$) of the differential amplifier having the next lower sequence number in the relevant group;

the second main electrode of the first transistor ($T_1$) of the differential amplifier having the highest sequence number within the relevant group is coupled to the first latch input terminal ($LI_1$) of a respective latch ($L_1$, $L_2$, $L_3$) of the plurality of latches; and the second main electrodes of the second 4 transistors ($T_2$) of the differential amplifiers within the relevant group are coupled alternately, in accordance with descending sequence numbers, to the second latch input terminal ($LI_2$) and the first latch input terminal ($LI_1$) of the respective latch ($L_1$, $L_2$, $L_3$);

each respective latch having a latch output terminal (LO) at which it supplies a respective bit of the N-bit digital output signal ($V_{out}$) in response to a difference signal between the first and second input terminals ($L_1$) and ($L_2$) of said latch.

* * * * *